(12) United States Patent
Park et al.

(10) Patent No.: US 11,968,915 B2
(45) Date of Patent: Apr. 23, 2024

(54) SELECTOR AND MEMORY DEVICE USING THE SAME

(71) Applicant: IUCF-HYU (INDUSTRY-UNIVERSITY COOPERATION FOUNDATION HANYANG UNIVERSITY), Seoul (KR)

(72) Inventors: Jea Gun Park, Seoul (KR); Soo Min Jin, Seoul (KR); Dong Won Kim, Seoul (KR); Hea Jee Kim, Seoul (KR); Dae Seong Woo, Seoul (KR); Sang Hong Park, Seoul (KR); Sung Mok Jung, Seoul (KR); Dong Eon Kim, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 301 days.

(21) Appl. No.: 17/480,699

(22) Filed: Sep. 21, 2021

(65) Prior Publication Data

US 2023/0011421 A1   Jan. 12, 2023

(30) Foreign Application Priority Data

Jul. 12, 2021   (KR) .................. 10-2021-0091250

(51) Int. Cl.
*G11C 11/34*   (2006.01)
*H10B 63/00*   (2023.01)
*H10N 70/00*   (2023.01)

(52) U.S. Cl.
CPC ........ *H10N 70/8416* (2023.02); *H10B 63/80* (2023.02); *H10N 70/8828* (2023.02); *H10N 70/883* (2023.02)

(58) Field of Classification Search
CPC ............. H10N 70/8416; H10N 70/883; H10N 70/8828; H10B 63/80
(Continued)

(56) References Cited

U.S. PATENT DOCUMENTS 7,989,924 B2 *   8/2011   Sakamoto .......... H10N 70/8416
                                                              257/E45.003
8,242,478 B2 *   8/2012   Sakamoto ............ H10N 70/253
                                                              257/209

(Continued)

FOREIGN PATENT DOCUMENTS

JP   2014-179571 A   9/2014
KR   10-2013-0060089 A   6/2013
(Continued)

OTHER PUBLICATIONS

Korean Notice of Allowance dated May 24, 2023 in Application No. 10-2021-0091250.
(Continued)

*Primary Examiner* — Viet Q Nguyen
(74) *Attorney, Agent, or Firm* — Sughrue Mion, PLLC

(57) ABSTRACT

A selector according to an embodiment of the present disclosure includes a first electrode; a second electrode disposed opposite to the first electrode; an ion supply layer disposed between the first electrode and the second electrode to be on the side of the first electrode and doped with a metal, wherein the doped metal diffuses toward the second electrode; a switching layer disposed between the first electrode and the second electrode to be on the side of the second electrode, wherein the doped metal diffuses from the ion
(Continued)

supply layer into the switching layer so that metal concentration distribution inside the switching layer is changed to generate metal filaments; and a diffusion control layer inserted between the ion supply layer and the switching layer, wherein the diffusion control layer serves to adjust electrical characteristics related to the generated metal filaments as the amount of the diffusing metal is adjusted in proportion to a thickness of the diffusion control layer.

17 Claims, 14 Drawing Sheets

(58) Field of Classification Search
USPC .......................................................... 365/182
See application file for complete search history.

(56) References Cited

U.S. PATENT DOCUMENTS

| | | | | |
|---|---|---|---|---|
| 8,847,192 | B2* | 9/2014 | Lee | H10N 70/24 |
| | | | | 257/42 |
| 9,118,007 | B2* | 8/2015 | Jo | H10N 70/841 |
| 9,601,692 | B1* | 3/2017 | Jo | H10N 70/841 |
| 9,685,608 | B2* | 6/2017 | Maxwell | H10N 70/883 |
| 9,761,635 | B1* | 9/2017 | Jo | G11C 13/0069 |
| 9,831,289 | B2* | 11/2017 | Herner | H10N 70/245 |
| 10,193,064 | B2* | 1/2019 | Chan | H10N 70/20 |
| 10,297,312 | B1* | 5/2019 | Futase | H10B 63/845 |
| 10,529,777 | B2* | 1/2020 | Sei | G11C 13/0007 |
| 10,622,557 | B2* | 4/2020 | Kim | H10N 70/245 |
| 10,804,321 | B2* | 10/2020 | Ohba | H10N 70/231 |
| 10,840,442 | B2* | 11/2020 | Jo | H10N 70/026 |
| 10,910,561 | B1* | 2/2021 | Maxwell | H10N 70/801 |
| 11,183,683 | B2* | 11/2021 | Chae | H01M 4/0404 |
| 11,462,685 | B2* | 10/2022 | Sei | H10N 70/231 |
| 2019/0172871 | A1* | 6/2019 | Yang | H01F 10/3254 |
| 2021/0036221 | A1* | 2/2021 | Ohba | H10N 70/20 |
| 2022/0165950 | A1* | 5/2022 | Hong | H10N 70/8833 |
| 2022/0293855 | A1* | 9/2022 | Mizuguchi | H10N 70/245 |

FOREIGN PATENT DOCUMENTS

| | | |
|---|---|---|
| KR | 10-2017-0130245 A | 11/2017 |
| KR | 10-2018-0015402 A | 2/2018 |
| KR | 10-2030341 B1 | 10/2019 |
| KR | 10-2072091 B1 | 1/2020 |
| TW | 201140582 A1 | 11/2011 |
| TW | 201507225 A | 2/2015 |
| TW | 202008514 A | 2/2020 |
| TW | 202046454 A | 12/2020 |
| TW | 202118106 A | 5/2021 |

OTHER PUBLICATIONS

Korean Office Action dated Nov. 18, 2022 in Korean Application No. 10-2021-0091250.
Taiwanese Office Action dated Dec. 23, 2022 in Taiwanese Application No. 110134506.

* cited by examiner

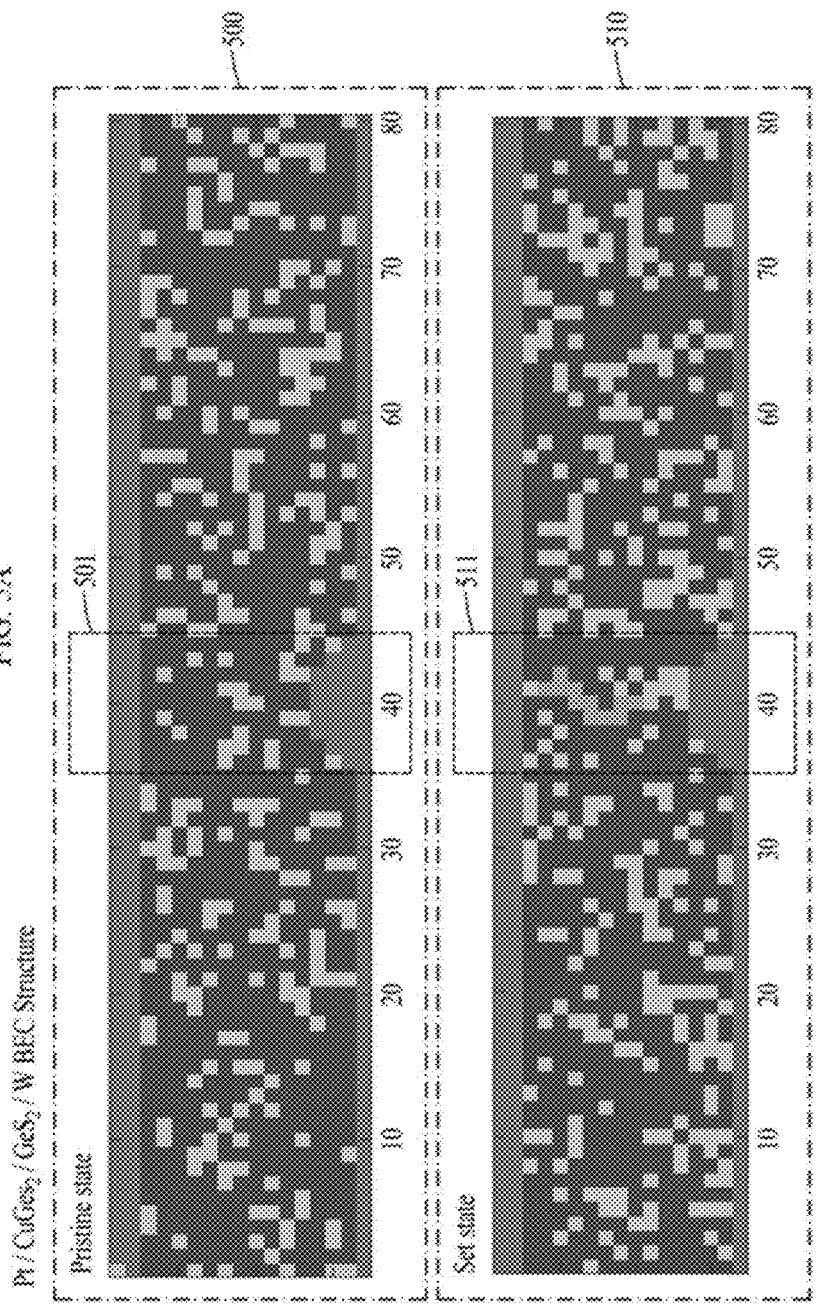

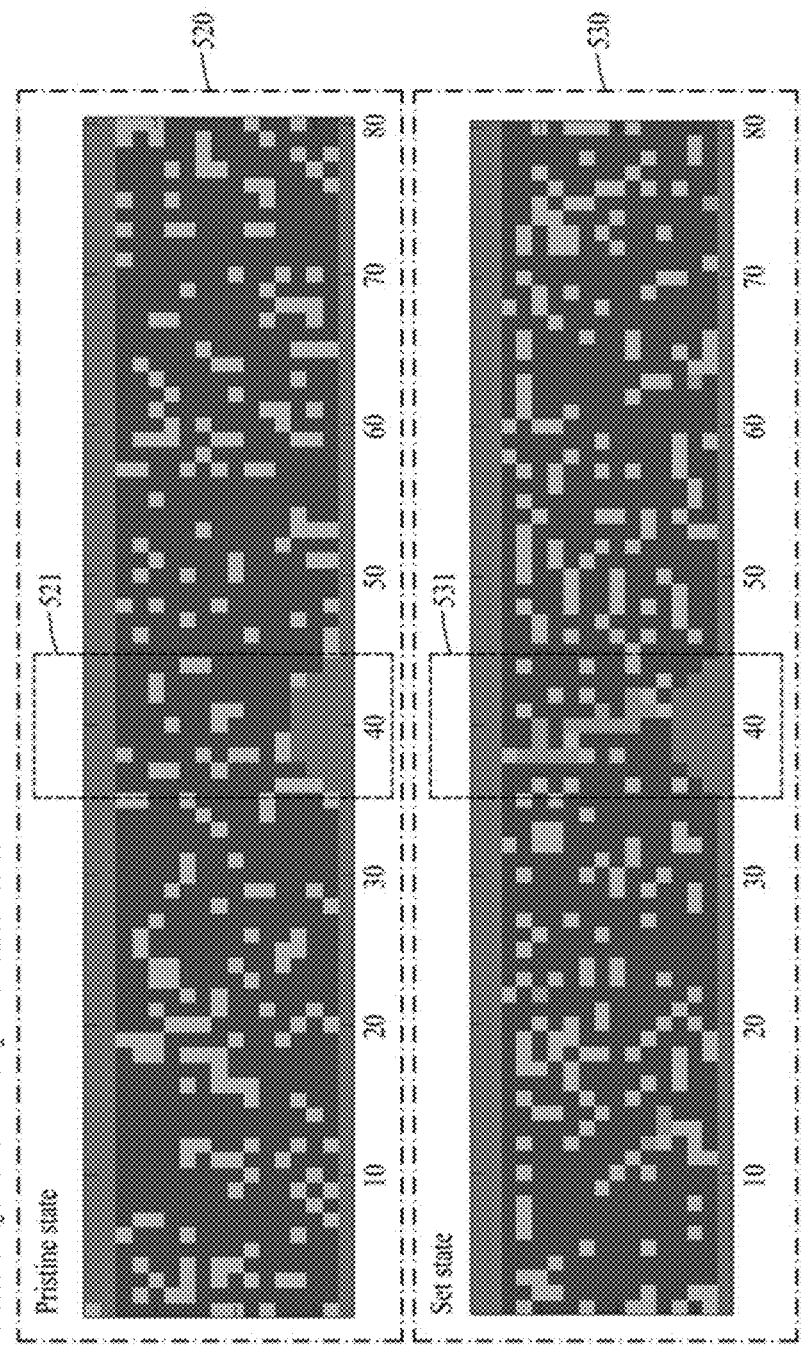

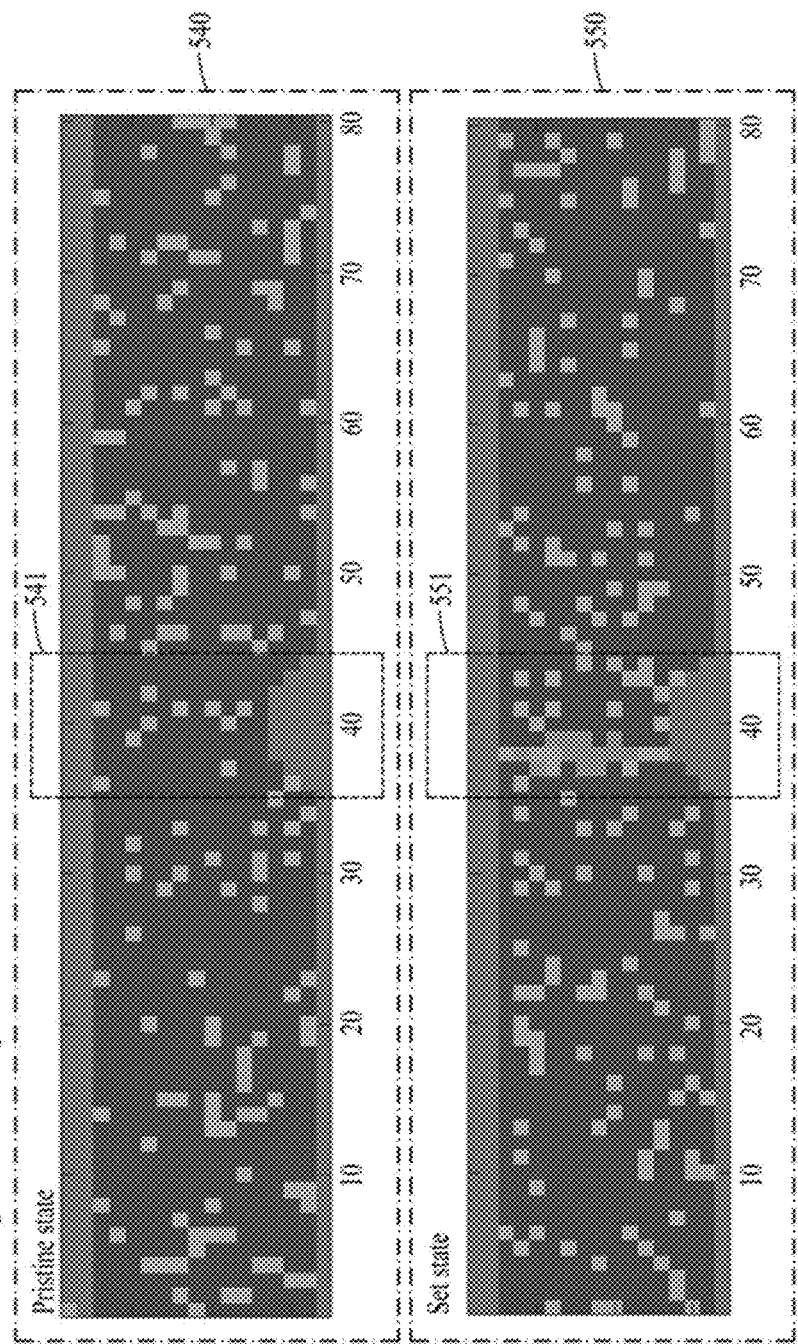

SELECTOR AND MEMORY DEVICE USING THE SAME

CROSS-REFERENCE TO RELATED APPLICATION

This application claims priority to Korean Patent Application No. 10-2021-0091250, filed on Jul. 12, 2021 in the Korean Intellectual Property Office, the disclosure of which is incorporated herein by reference.

BACKGROUND OF THE DISCLOSURE

Field of the Disclosure

The present disclosure relates to a selector and a memory device using the same, and more particularly, to a technology of being capable of controlling the electrical characteristics of a selector by inserting a diffusion control layer between an ion supply layer and switching layer constituting the selector.

Description of the Related Art

In the semiconductor industry, new concepts such as insertion of a dynamic random access memory (DRAM) into a memory hierarchy and insertion of a storage-class memory (SCM) into a solid state drive (SSD)/NAND flash memory have recently been proposed.

SCM has the potential to overcome the physical scaling-down limit of 3D NAND flash memory called 3D cross-point memory.

A cross-point memory cell has a 1 selector and 1 resistor (1S1R) structure wherein a selector with high selectivity and high reliability is vertically laminated on memory cells of PCRAM, ReRAM, and p-STT-MRAM.

To develop highly integrated cross-point memory cells, it is essential to develop a selector with high selectivity and high reliability so as to address leakage current problems.

When a cross-point array is constituted using the structure wherein a selector is vertically laminated on 1R of a 1S1R structure according to an existing technology, a desired voltage can be applied to a desired cell without leakage current.

The mixed ionic electronic conduction (MIEC) material-based selector, announced by IBM, among currently reported selectors, has a structure including an upper electrode, an MIEC layer and a lower electrode and has an off-current of 10 pA or less and a selectivity of $10^4$ or more.

Since a selector is used together with other memory devices, the electrical characteristics, such as a threshold voltage, a hold voltage and a selectivity, of the selector should match the characteristics of a memory device. Accordingly, it is easy to use to the 1S1R structure when the characteristics of a selector are adjustable.

With regard to the existing MIEC material-based selector announced by IBM, materials constituting the switch layer of the selector have not been particularly disclosed, and a method of adjusting electrical characteristics has not been proposed.

RELATED ART DOCUMENTS

Patent Documents

Korean Patent No. 10-2030341, "Selector and memory device using the same"

Korean Patent Application Publication No. 10-2018-0015402, "Nonvolatile MEMORY DEVICE"

Korean Patent No. 10-2072091, "Resistive RAM including selector that acts as switch"

SUMMARY OF THE DISCLOSURE

Therefore, the present disclosure has been made in view of the above problems, and it is an object of the present disclosure to provide a selector having the structure wherein a diffusion control layer is inserted between a metal-doped ion supply layer and a switching layer, thus being capable of securing high selectivity and low leakage current.

It is another object of the present disclosure to control the electrical characteristics (threshold voltage, hold voltage and selectivity) of the selector by adjusting metal concentration distribution inside the switching layer depending upon the thickness of the diffusion control layer disposed between the metal-doped ion supply layer and the switching layer.

It is another object of the present disclosure to secure the endurance of the selector by inserting the diffusion control layer between the metal-doped ion supply layer and the switching layer.

It is yet another object of the present disclosure to provide a selector having high selectivity and high reliability which is necessary for the development of a highly integrated cross-point array memory having a 1selector-1resistor (1S1R) structure used in a storage class memory (SCM).

In accordance with an aspect of the present disclosure, the above and other objects can be accomplished by the provision of a selector, including: a first electrode; a second electrode disposed opposite to the first electrode; an ion supply layer disposed between the first electrode and the second electrode to be on the side of the first electrode and doped with a metal, wherein the doped metal diffuses toward the second electrode; a switching layer disposed between the first electrode and the second electrode to be on the side of the second electrode, wherein the doped metal diffuses from the ion supply layer into the switching layer so that metal concentration distribution inside the switching layer is changed to generate metal filaments; and a diffusion control layer inserted between the ion supply layer and the switching layer, wherein the diffusion control layer serves to adjust electrical characteristics related to the generated metal filaments as the amount of the diffusing metal is adjusted in proportion to a thickness of the diffusion control layer.

At least one electrical characteristic of a threshold voltage (Vth), a hold voltage (Vh) and a selectivity may increase as the thickness of the diffusion control layer increases.

When the thickness of the diffusion control layer may be 0 nm to 2 nm, the threshold voltage ($V_{th}$) may be adjusted to 0.6 V to 1 V, the hold voltage ($V_h$) may be adjusted to 0 V to 0.25 V, and the selectivity may be adjusted to $4.59 \times 10^5$ to $3.10 \times 10^6$.

The diffusion control layer may adjust a switching time, related to generation of the metal filaments, to increase as the thickness of the diffusion control layer increases.

The diffusion control layer may adjust endurance related to the generated metal filaments according to a change in the thickness of the diffusion control layer.

The first and second electrodes may be formed of at least one metal material selected from among platinum (Pt), tungsten (W), titanium nitride (TiN), tantalum nitride (TaN), gold (Au), rubidium (Ru), iridium (Ir), palladium (Pd), titanium (Ti), hafnium (Hf), molybdenum (Mo) and niobium (Nb).

The ion supply layer and the switching layer may be formed of at least one chalcogenide material selected from among germanium sulfide ($GeS_2$), germanium selenide ($GeSe_2$), germanium telluride (GeTe), silicon sulfide (SiS), silicon selenide (SiSe), silicon telluride (SiTe), zinc sulfide (ZnS), zinc selenide (ZnSe), zinc telluride (ZnTe), antimony sulfide (SbS), antimony selenide (SbSe) and antimony telluride (SbTe).

The metal doped on the ion supply layer may be at least one selected from among copper (Cu), silver (Ag), nickel (Ni) and titanium (Ti).

The diffusion control layer may be formed of at least one material selected from among titanium nitride (TiN), tantalum nitride (TaN), tungsten nitride (WN), silicon nitride (SiN), aluminium nitride (AlN) and hafnium nitride (HfN).

In accordance with another aspect of the present disclosure, there is provided a memory device, including: first and second wirings crossing each other; memory layers provided at intersections between the first wirings and the second wirings; and the selectors provided between the memory layers and the first wirings or between the memory layers and the second wirings.

The memory device may include at least one of a storage class memory (SCM) and a 3D cross point memory.

BRIEF DESCRIPTION OF THE DRAWINGS

The above and other objects, features and other advantages of the present disclosure will be more clearly understood from the following detailed description taken in conjunction with the accompanying drawings, in which:

FIGS. 5A to 5C illustrate filament simulations dependent upon thickness changes in diffusion control layers according to embodiments of the present disclosure;

DETAILED DESCRIPTION OF THE DISCLOSURE

Figure 1:
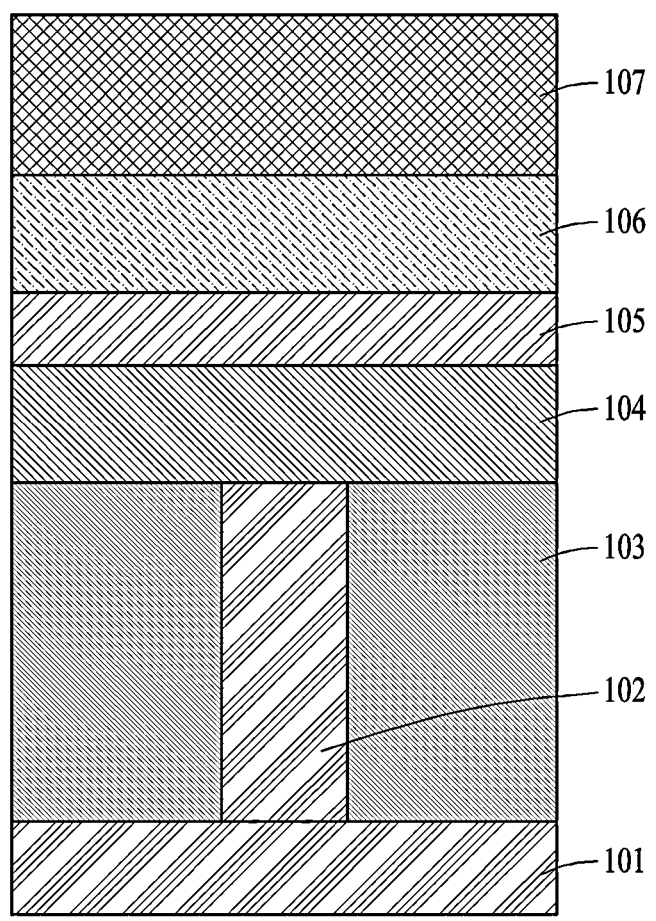
FIG. 1 illustrates a selector according to an embodiment of the present disclosure.

The present disclosure will now be described more fully with reference to the accompanying drawings, in which exemplary embodiments of the disclosure are shown.

This disclosure, however, should not be construed as limited to the exemplary embodiments and terms used in the exemplary embodiments, and should be understood as including various modifications, equivalents, and substituents of the exemplary embodiments.

Preferred embodiments of the present disclosure are now described more fully with reference to the accompanying drawings. In the description of embodiments of the present disclosure, certain detailed explanations of related known functions or constructions are omitted when it is deemed that they may unnecessarily obscure the essence of the disclosure.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In the drawings, like reference numerals in the drawings denote like elements.

As used herein, the singular forms "a," "an" and "the" are intended to include the plural forms as well, unless context clearly indicates otherwise.

Expressions such as "A or B" and "at least one of A and/or B" should be understood to include all possible combinations of listed items.

Expressions such as "a first," "the first," "a second" and "the second" may qualify corresponding components irrespective of order or importance and may be only used to distinguish one component from another component without being limited to the corresponding components.

In the case in which a (e.g., first) component is referred as "(functionally or communicatively) connected" or "attached" to another (e.g., second) component, the first component may be directly connected to the second component or may be connected to the second component via another component (e.g., third component).

In the specification, the expression " . . . configured to . . . (or set to)" may be used interchangeably, for example, with expressions, such as " . . . suitable for . . . ," " . . . having ability to . . . ," " . . . modified to . . . ," " . . . manufactured to . . . ," "enabling to . . . ," or " . . . designed to . . . ," in the case of hardware or software depending upon situations.

In any situation, the expression "a device configured to . . . " may refer to a device configured to operate "with another device or component."

For examples, the expression "a processor configured (or set) to execute A, B, and C" may refer to a specific processor performing a corresponding operation (e.g., embedded processor), or a general-purpose processor (e.g., CPU or application processor) executing one or more software programs stored in a memory device to perform corresponding operations.

In addition, the expression "or" means "inclusive or" rather than "exclusive or".

That is, unless otherwise mentioned or clearly inferred from context, the expression "x uses a or b" means any one of natural inclusive permutations.

In the aforementioned embodiments, constituents of the present disclosure were expressed in a singular or plural form depending upon embodiments thereof.

However, the singular or plural expressions should be understood to be suitably selected depending upon a suggested situation for convenience of description, and the aforementioned embodiments should be understood not to be limited to the disclosed singular or plural forms. In other words, it should be understood that plural constituents may be a singular constituent or a singular constituent may be plural constituents.

While the embodiments of the present disclosure have been described, those skilled in the art will appreciate that many modifications and changes can be made to the present disclosure without departing from the spirit and essential characteristics of the present disclosure.

Therefore, it should be understood that there is no intent to limit the disclosure to the embodiments disclosed, rather, the disclosure is to cover all modifications, equivalents, and alternatives falling within the spirit and scope of the disclosure as defined by the claims.

FIG. 1 illustrates a selector according to an embodiment of the present disclosure.

Referring to FIG. 1, a selector 100 according to an embodiment of the present disclosure includes a second electrode 101, a plug 102, a substrate 103, a switching layer 104, a diffusion control layer 105, an ion supply layer 106 and a first electrode 107.

For example, to secure high selectivity and low leakage current compared to a mixed ionic electronic conduction (MIEC) material-based selector as an existing technology, at least one electrical characteristic of a threshold voltage ($V_{th}$), a hold voltage ($V_h$) and a selectivity may be adjusted as the thickness of the diffusion control layer 105, disposed between the ion supply layer 106 and switching layer 104 included in the selector 100, is adjusted.

According to an embodiment of the present disclosure, the selector 100 includes the first electrode 107; and the second electrode 101 disposed opposite to the first electrode 107.

For example, the selector 100 includes the ion supply layer 106. The ion supply layer 106 is disposed between the first electrode 107 and the second electrode 101 to be on the side of the first electrode 107, and is doped with a metal. The doped metal diffuses into the switching layer 104 disposed on the side of the second electrode 101.

According to an embodiment of the present disclosure, the selector 100 includes the switching layer 104. The switching layer 104 is disposed between the first electrode 107 and the second electrode 101 to be on the side of the second electrode 101. As the doped metal diffuses from the ion supply layer 106 into the ion supply layer 106, metal concentration distribution in the selector 100 is changed, so that the switching layer 104 generates metal filaments.

For example, the selector 100 includes the diffusion control layer 105. The diffusion control layer 105 is inserted between the ion supply layer 106 and the switching layer 104. As the amount of metal diffusing into the switching layer 104 from the ion supply layer 106 is adjusted in proportion to the thickness of the diffusion control layer 105, electrical characteristics related to the metal filaments generated inside the switching layer 104 may be adjusted.

According to an embodiment of the present disclosure, the first electrode 107 and the second electrode 101 may be formed of at least one metal material selected from among platinum (Pt), tungsten (W), titanium nitride (TiN), tantalum nitride (TaN), gold (Au), rubidium (Ru), iridium (Ir), palladium (Pd), titanium (Ti), hafnium (Hf), molybdenum (Mo) and niobium (Nb). Here, the plug 102 is formed of the same material as the second electrode 101.

For example, the ion supply layer 106 and the switching layer 104 may be formed of at least one chalcogenide material selected from among germanium sulfide ($GeS_2$), germanium selenide ($GeSe_2$), germanium telluride (GeTe), silicon sulfide (SiS), silicon selenide (SiSe), silicon telluride (SiTe), zinc sulfide (ZnS), zinc selenide (ZnSe), zinc telluride (ZnTe), antimony sulfide (SbS), antimony selenide (SbSe) and antimony telluride (SbTe).

The diffusivity of a metal inside a switching layer is relatively fast in chalcogenide materials, compared to oxide materials.

Accordingly, chalcogenide materials can be easily applied to a selector having volatility because, when no voltage is applied, a metal material is diffused so that filaments are cut.

Thereamong, germanium sulfide ($GeS_2$) has a relatively large band gap compared to other chalcogenide materials, thus having a very low leakage current value.

For example, a metal with which the ion supply layer 106 is to be doped may be any one selected from among copper (Cu), silver (Ag), nickel (Ni) and titanium (Ti).

According to an embodiment of the present disclosure, the diffusion control layer 105 may be formed of at least one material selected from among titanium nitride (TiN), tantalum nitride (TaN), tungsten nitride (WN), silicon nitride (SiN), aluminium nitride (AlN) and hafnium nitride (HfN).

Hereinafter, an embodiment of the selector 100 wherein the first electrode 107 is formed of platinum (Pt), the second electrode 101 is formed of tungsten (W), the ion supply layer 106 is formed by doping germanium sulfide ($GeS_2$) with copper (Cu), the switching layer 104 is formed of germanium sulfide ($GeS_2$), and the diffusion control layer 105 is formed of titanium nitride (TiN) is described.

For example, the substrate 103 may be a plug-type tungsten (W) background equivalent concentration (BEC) wafer.

That is, as the thickness of the diffusion control layer 105 inserted between the ion supply layer 106 and switching layer 104 of the selector 100 is adjusted according to an embodiment of the present disclosure, the concentration of copper diffusing from the ion supply layer 106 into the switching layer 104 may be controlled.

Accordingly, the electrical characteristics, such as a threshold voltage, a hold voltage and a selectivity, of the selector 100 may be adjusted according to the characteristics of a memory element to be used, so that the selector 100 may be easily used as a 1S1R structure.

Therefore, the present disclosure can provide a selector having high selectivity and high reliability which is necessary for the development of a highly integrated cross-point array memory having a 1selector-1resistor (1S1R) structure used in a storage class memory (SCM).

Figure 2A:
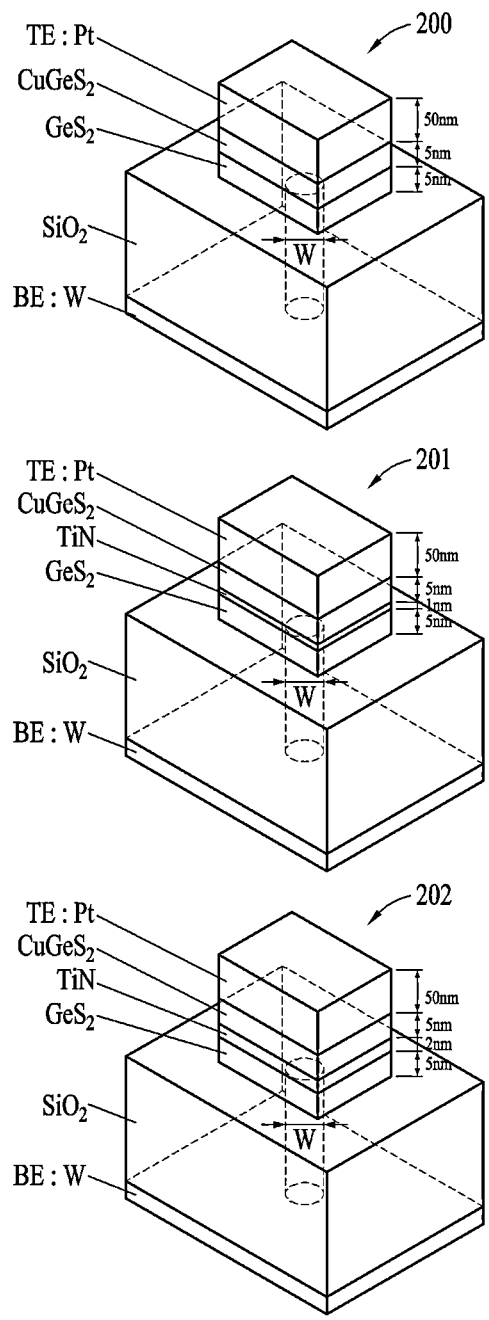
FIG. 2A illustrates selectors according to embodiments of the present disclosure dependent upon thickness change of a diffusion control layer.

FIG. 2A illustrates selectors according to embodiments of the present disclosure dependent upon thickness change of a diffusion control layer.

FIG. 2A illustrates schematic diagrams of various selectors having different diffusion control layer thicknesses according to embodiments of the present disclosure.

Referring to FIG. 2A, a selector 200 includes a first electrode (TE:Pt), an ion supply layer ($CuGeS_2$), a switching layer ($GeS_2$) and a second electrode (BE:W) and has the structure wherein a plug (W) connects a switching layer ($GeS_2$) and a second electrode (BE:W) to a substrate ($SiO_2$) through a hole.

Figure 2B:
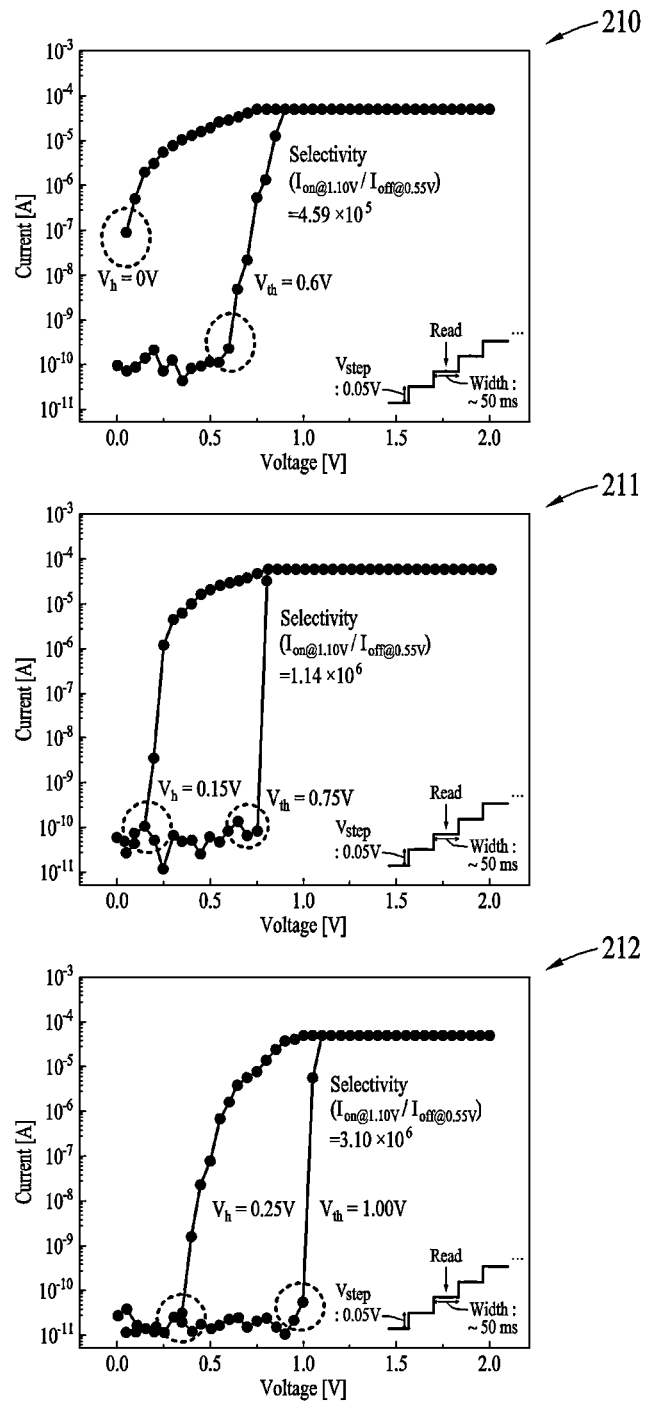
FIG. 2B illustrates current and voltage characteristics, which are dependent upon a thickness change in a diffusion control layer, of selectors according to embodiments of the present disclosure.

Referring to FIGS. 2B and 2c, each of a selector 201 and a selector 202 includes a first electrode (TE:Pt), an ion supply layer ($CuGeS_2$), a diffusion control layer (TiN), a switching layer ($GeS_2$) and a second electrode (BE:W), and has the structure wherein a plug (W) connects a switching layer (GeS$_2$) and a second electrode (BE:W) to a substrate (SiO$_2$) through a hole.

The selector 200, the selector 201 and the selector 202 respectively include the diffusion control layers (TiN) having different thicknesses.

First, the selector 200 has the Pt/Cu-doped GeS$_2$/GeS$_2$/W structure into which a diffusion control layer (TiN) is not inserted.

In the case of the selector 200 into which a diffusion control layer (TiN) is not inserted, the amount of copper diffused from the copper-doped ion supply layer (CuGeS$_2$) into the switching layer (GeS$_2$) is excessively large, so that stable filaments may be formed.

Next, in the case of the selector 201 having the Pt/Cu-doped GeS$_2$/TiN/GeS$_2$/W structure, the amount of copper diffused from the copper-doped ion supply layer (CuGeS$_2$) into the switching layer (GeS$_2$) is relatively small, compared to the case wherein the diffusion control layer (TiN) is not inserted, due to insertion of the diffusion control layer (TiN) having a thickness of 1 mm, so that relatively unstable filaments may be formed.

Finally, in the case of the selector 202 having the Pt/Cu-doped GeS$_2$/TiN/GeS$_2$/W structure, the amount of copper diffused from the copper-doped ion supply layer (CuGeS$_2$) into the switching layer (GeS$_2$) is very small due to insertion of the diffusion control layer (TiN) having a thickness of 2 mm, so that filaments in the most unstable state may be formed.

The components of the selector 200, the selector 201 and the selector 202 are the same except for the thickness of the diffusion control layer (TiN).

For example, the thickness of the first electrode (TE:Pt) may be 50 nm, the thickness of the ion supply layer (CuGeS$_2$) may be 5 nm, and the thickness of the switching layer (GeS$_2$) may be 5 nm.

FIG. 2B illustrates current and voltage characteristics, which are dependent upon a thickness change in a diffusion control layer, of selectors according to embodiments of the present disclosure.

FIG. 2B illustrates the current and voltage characteristics of the selectors 200, 201 and 202 illustrated in FIG. 2A.

Referring to FIG. 2B, graph 210 illustrates a measurement result of the selector 200, graph 211 illustrates a measurement result of the selector 201, and graph 212 illustrates a measurement result of the selector 202.

Referring to graph 210, it can be confirmed that the selector 200 excluding a diffusion control layer exhibits a threshold voltage ($V_{th}$) of 0.6 V, a hold voltage ($V_h$) of 0 V, and a selectivity of 4.59×10$^5$.

Referring to graph 211, it can be confirmed that the selector 201 including a diffusion control layer having a thickness of 1 nm exhibits a threshold voltage ($V_{th}$) of 0.75 V, a hold voltage ($V_h$) of 0.15 V, and a selectivity of 1.14×10$^6$.

From these results, it can be confirmed that, compared to the selector 200, a threshold voltage ($V_{th}$) for filament formation of the selector 201 increases and a hold voltage ($V_h$) thereof increases due to inclusion of relatively unstable filaments.

Referring to graph 212, it can be confirmed that the selector 202 including a diffusion control layer having a thickness of 2 nm exhibits a threshold voltage ($V_{th}$) of 1.00 V, a hold voltage ($V_h$) of 0.25 V, and a selectivity of 3.10×10$^6$.

From these results, it can be confirmed that, compared to the selector 201, a threshold voltage ($V_{th}$) for filament formation of the selector 202 increases, and a hold voltage ($V_h$) thereof increases due to inclusion of filaments in a relatively unstable state.

That is, the results show that the threshold voltage ($V_{th}$), hold voltage ($V_h$) and selectivity, as electrical characteristics, of the selector according to an embodiment of the present disclosure can be controlled by adjusting the thickness of the diffusion control layer included in the selector to adjust the concentration of copper inside the switching layer of the selector.

For example, at least one electrical characteristic of the threshold voltage ($V_{th}$), the hold voltage ($V_h$) and the selectivity can increase as the thickness of the diffusion control layer increases.

In addition, when the thickness of the diffusion control layer is 0 nm to 2 nm, the threshold voltage ($V_{th}$) may be adjusted to 0.6 V to 1 V, the hold voltage ($V_h$) thereof may be adjusted to 0 V to 0.25 V, and the selectivity thereof may be adjusted to 4.59×10$^5$ to 3.10×10$^6$.

Accordingly, the present disclosure can provide a selector having the structure wherein the diffusion control layer is inserted between the metal-doped ion supply layer and the switching layer, thereby being capable of securing high selectivity and low leakage current.

Figure 3A:
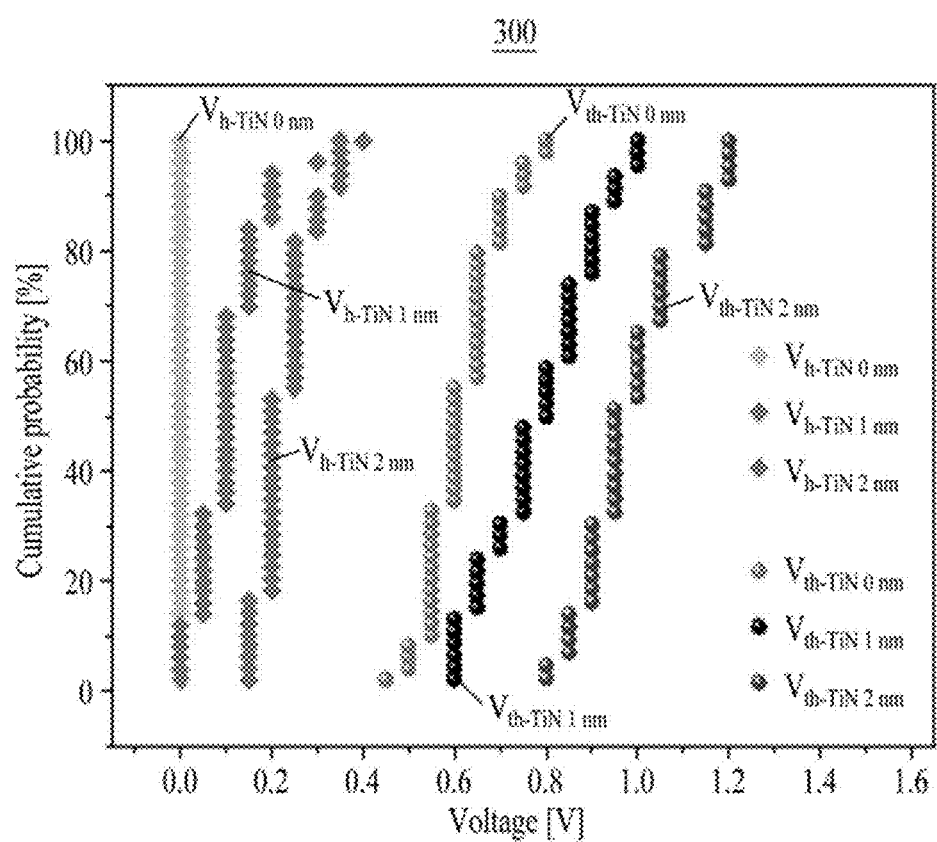
FIG. 3A illustrates cumulative distribution of the threshold voltages and hold voltages, which are dependent upon the thickness of a diffusion control layer, of selectors according to embodiments of the present disclosure.

FIG. 3A illustrates cumulative distribution of the threshold voltages and hold voltages, which are dependent upon the thickness of a diffusion control layer, of selectors according to embodiments of the present disclosure.

FIG. 3A illustrates cumulative distribution of changes in a threshold voltage and hold voltage among electrical characteristics that are dependent upon a thickness change in a diffusion control layer in selectors according to embodiments of the present disclosure.

Referring to FIG. 3A, graph 300 shows cumulative distribution of a threshold voltage and a hold voltage at DC I-V which are dependent upon a thickness change in the diffusion control layer.

As shown in graph 300, as the thickness of the diffusion control layer increases to 0 nm, 1 nm, and 2 nm, average threshold voltages increase to 0.62 V, 0.79 V, and 0.99 V and average hold voltages increase 0 V, 0.11 V, and 0.23 V.

That is, the threshold voltage and hold voltage of the selector may be controlled depending upon the thickness of the diffusion control layer inserted between the ion supply layer and the switching layer.

Figure 3B:
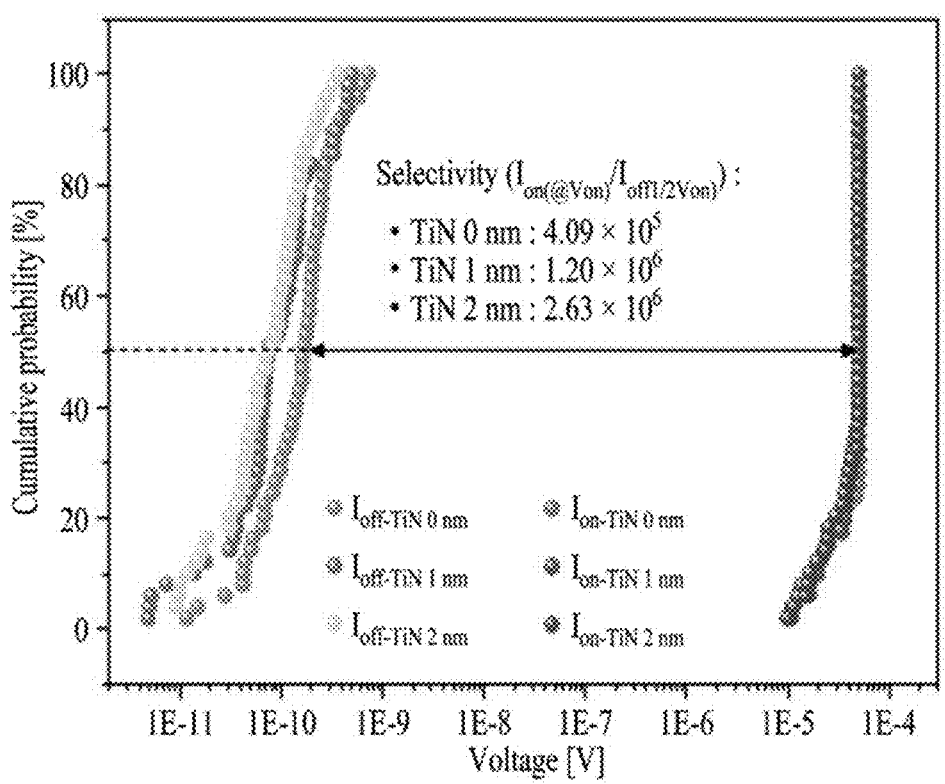
FIG. 3B illustrates cumulative distribution of on-current and off-current, which are dependent upon the thickness of a diffusion control layer, of selectors according to embodiments of the present disclosure.

FIG. 3B illustrates cumulative distribution of on-current and off-current, which are dependent upon the thickness of a diffusion control layer, of selectors according to embodiments of the present disclosure.

FIG. 3B illustrates cumulative distribution of changes in on-current and off-current related to a selectivity that is one of electrical characteristics dependent upon a thickness change in a diffusion control layer included in selectors according to an embodiment of the present disclosure.

Referring to FIG. 3B, graph 310 illustrates on-current and off-current at DC I-V which are dependent upon a thickness change in the diffusion control layer; and a selectivity related to the on-current and the off-current.

As shown in graph 310, average off-current values decrease to 1.20×10$^{-10}$A, 4.11×10$^{-11}$A, and 1.89×10$^{-11}$A as the thickness of the diffusion control layer increases to 0 nm, 1 nm, and 2 nm.

In addition, average on-current values are 4.96×10$^{-5A}$, 4.94×10$^{-5A}$, 4.91×10$^{-5A}$, without significant change, due to compliance current as the thickness of the diffusion control layer increases to 0 nm, 1 nm, and 2 nm.

Meanwhile, the selectivity values increase to $4.13 \times 10^5$, $1.20 \times 10^6$, and $2.60 \times 10^6$ as the thickness of the diffusion control layer increases to 0 nm, 1 nm, and 2 nm.

From the results, it can be confirmed that the amount of diffusing copper is decreased as the thickness of the diffusion control layer increases, which causes threshold voltage increase, hold voltage increase, off-current decrease and selectivity increase. This indicates that the electrical characteristics of the selector can be controlled.

Accordingly, the present disclosure may control the electrical characteristics (threshold voltage, hold voltage and selectivity) of the selector by adjusting the concentration distribution of metal inside the switching layer depending upon the thickness of the diffusion control layer disposed between the metal-doped ion supply layer and the switching layer.

Figure 4A:
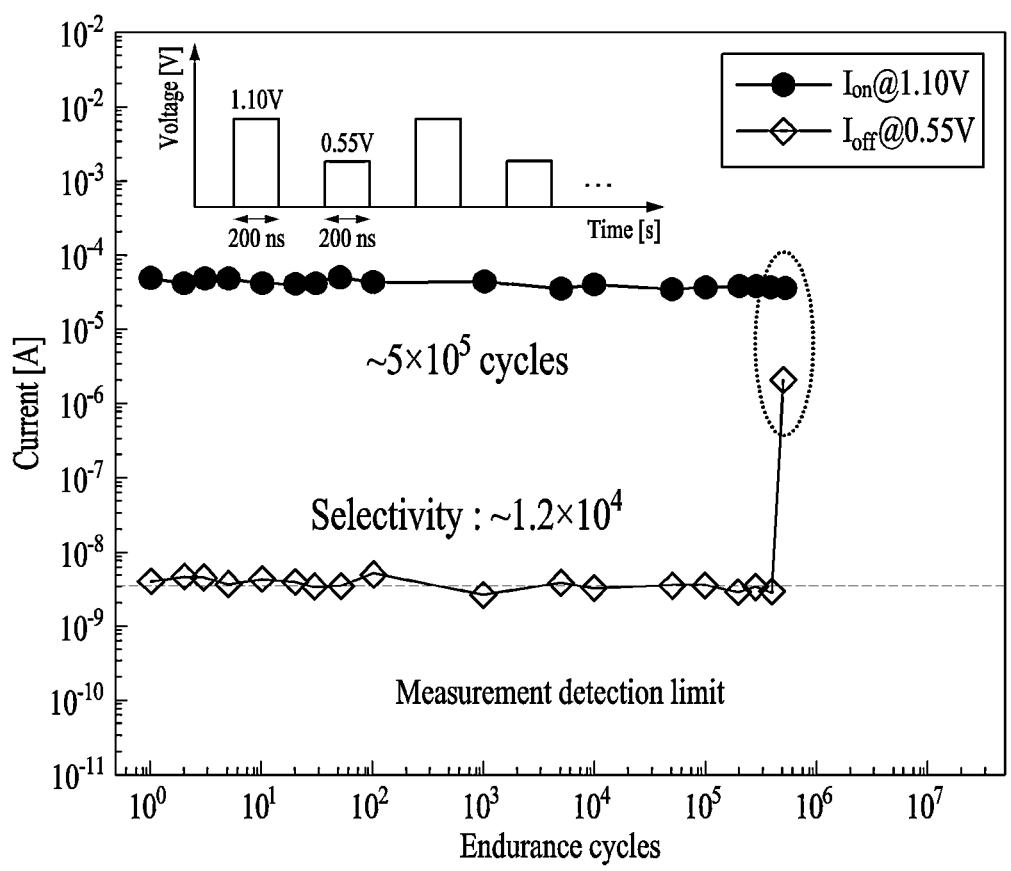
FIGS. 4A to 4C illustrate endurance, which is dependent upon a change in the thickness of a diffusion control layer, of selectors according to embodiments of the present disclosure.
Figure 4B:
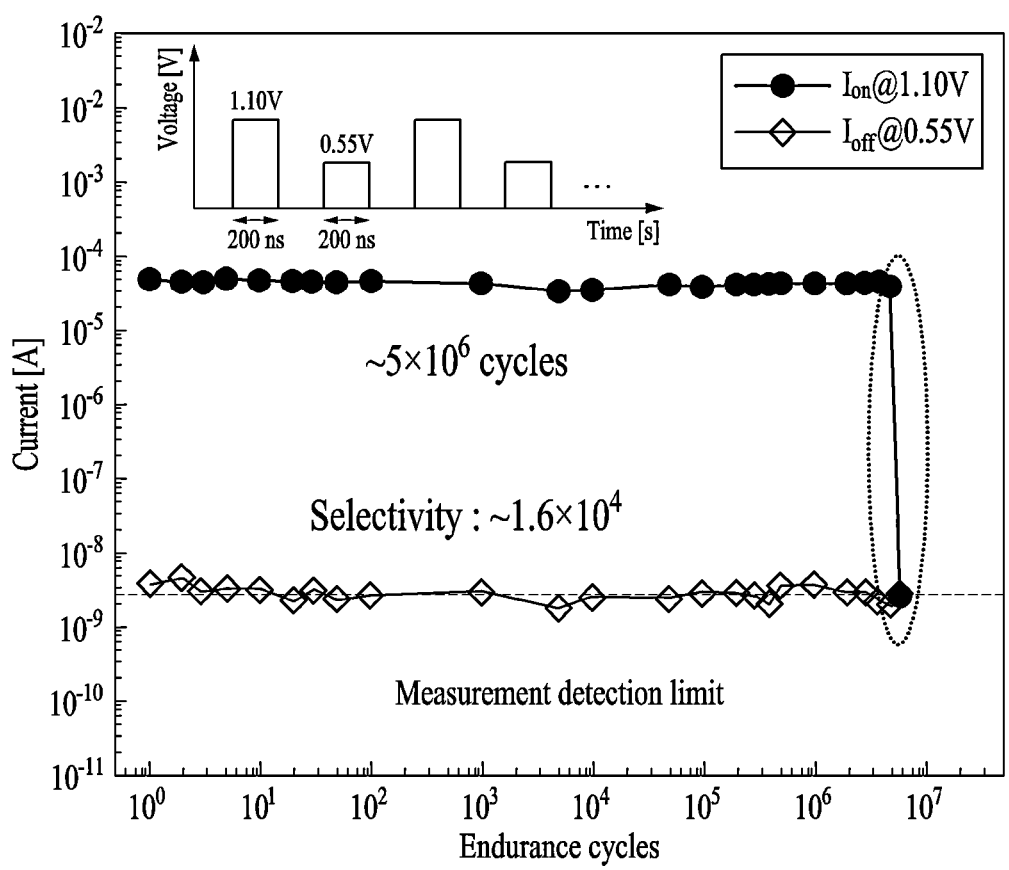
Figure 4C:
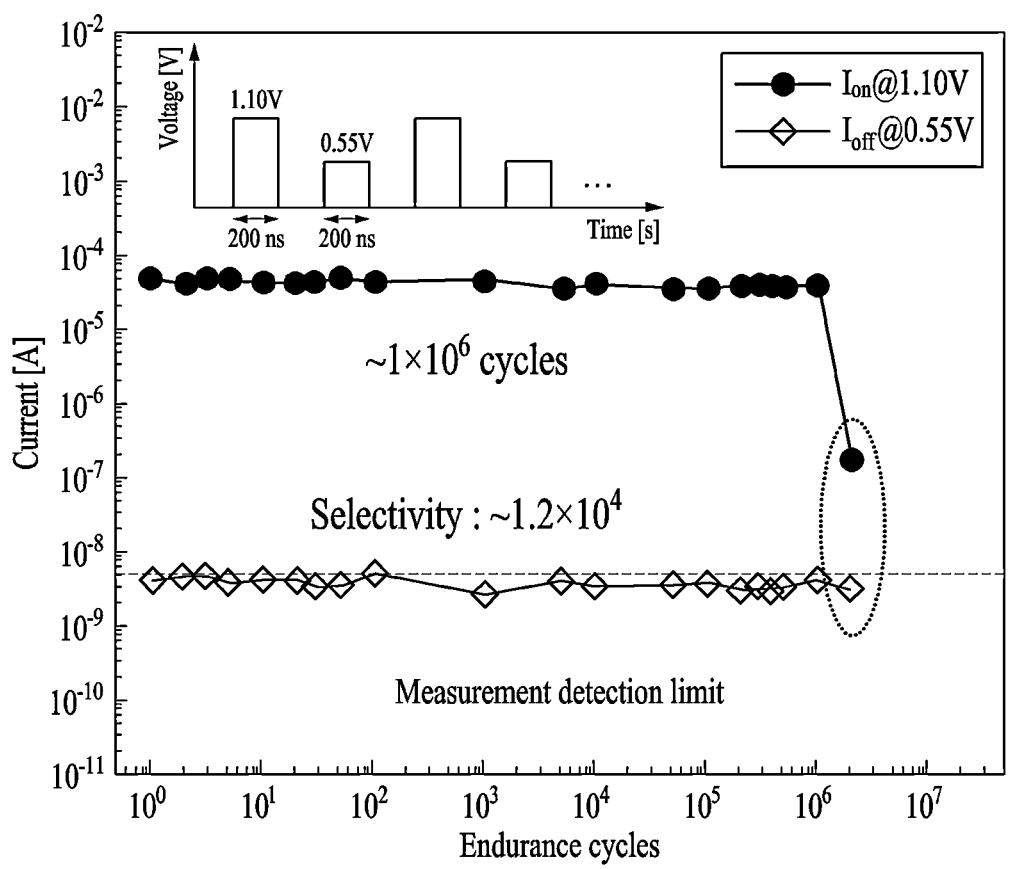

FIGS. 4A to 4C illustrate endurance, which is dependent upon a change in the thickness of a diffusion control layer, of selectors according to embodiments of the present disclosure.

FIGS. 4A to 4C illustrate the endurance-related characteristics, which are dependent upon a change in the thickness of an inserted diffusion control layer, of the selectors according to embodiments of the present disclosure.

According to an embodiment of the present disclosure, the endurance related to metal filaments generated inside the switching layer may be adjusted depending upon a change in the thickness of the diffusion control layer.

In other words, the endurance of the selector may be controlled by adjusting the diffusion of metal ions, related to metal filaments generated inside the switching layer, according to a change in the thickness of the diffusion control layer.

Graph 400 of FIG. 4A illustrates the endurance of a selector into which a diffusion control layer is not inserted.

According to an embodiment of the present disclosure, in the case of the selector into which a diffusion control layer is not inserted, the amount of copper diffusing from the ion supply layer, doped with copper, into the switching layer is excessively large due to the absence of the diffusion control layer.

Accordingly, the lowest endurance of $5 \times 10^5$ cycles is exhibited, and the set stuck fail phenomenon wherein the characteristics of the selector are lost may occur because copper filaments are no longer cut in the switching layer.

Graph 410 of FIG. 4B illustrates the endurance of the selector into which the diffusion control layer having a thickness of 1 nm is inserted.

In the case of the selector, into which the diffusion control layer having a thickness of 1 nm is inserted, according to an embodiment of the present disclosure, the amount of copper diffusing from the copper-doped ion supply layer to the switching layer is appropriately adjusted due to the presence of the diffusion control layer having a thickness of 1 nm. Accordingly, the best endurance of $5 \times 10^6$ cycle is exhibited.

Graph 420 of FIG. 4C illustrates the endurance of the selector into which the diffusion control layer having a thickness of 2 nm is inserted.

In the case of the selector, into which the diffusion control layer having a thickness of 2 nm is inserted, according to an embodiment of the present disclosure, the amount of copper diffusing from the copper-copper doped ion supply layer to the switching layer is very small due to the presence of the diffusion control layer having a relatively thick thickness of 2 nm. Accordingly, an endurance of $1 \times 10^6$ cycle is exhibited.

That is, the selector, into which the diffusion control layer having a thickness of 2 nm is inserted, exhibits better endurance, compared to the selector into which the diffusion control layer is not inserted, but exhibits poor endurance compared to the selector into which the diffusion control layer having a thickness of 1 nm is inserted.

Accordingly, the present disclosure may secure the endurance of the selector by inserting the diffusion control layer between the metal-doped ion supply layer and the switching layer.

FIGS. 5A to 5C illustrate filament simulations dependent upon thickness changes in diffusion control layers according to embodiments of the present disclosure.

FIG. 5A illustrates filament simulations of the selector, into which a diffusion control layer is not inserted, according to an embodiment of the present disclosure.

Referring to FIG. 5A, it can be confirmed that the simulation images illustrate a pristine state 500 and a program state 510. Comparing a region 501 with a region 511, it can be confirmed that metal filaments are formed in the program state 510.

FIG. 5B illustrates filament simulations of the selector, into which the diffusion control layer having a thickness of 1 nm is inserted, according to an embodiment of the present disclosure.

Referring to FIG. 5B, the simulation images illustrate a pristine state 520 and a program state 530. Comparing a region 521 with a region 531, it can be confirmed that metal filaments are formed in a program state 530.

FIG. 5C illustrates filament simulations of the selector, into which the diffusion control layer having a thickness of 2 nm is inserted, according to an embodiment of the present disclosure.

Referring to FIG. 5C, the simulation images illustrate a pristine state 540 and a program state 550. Comparing a region 541 with a region 551, it can be confirmed that metal filaments are formed in a program state 550.

That is, referring to FIGS. 5A to 5C, it can be confirmed that metal filaments are connected in a program state when voltage is applied in a pristine state.

For example, comparing the regions 511, 531 and 551 in which metal filaments are formed in a program state, it can be confirmed that the threshold voltage characteristic is changed and adjustable depending upon the thickness of the diffusion control layer.

Figure 6A:
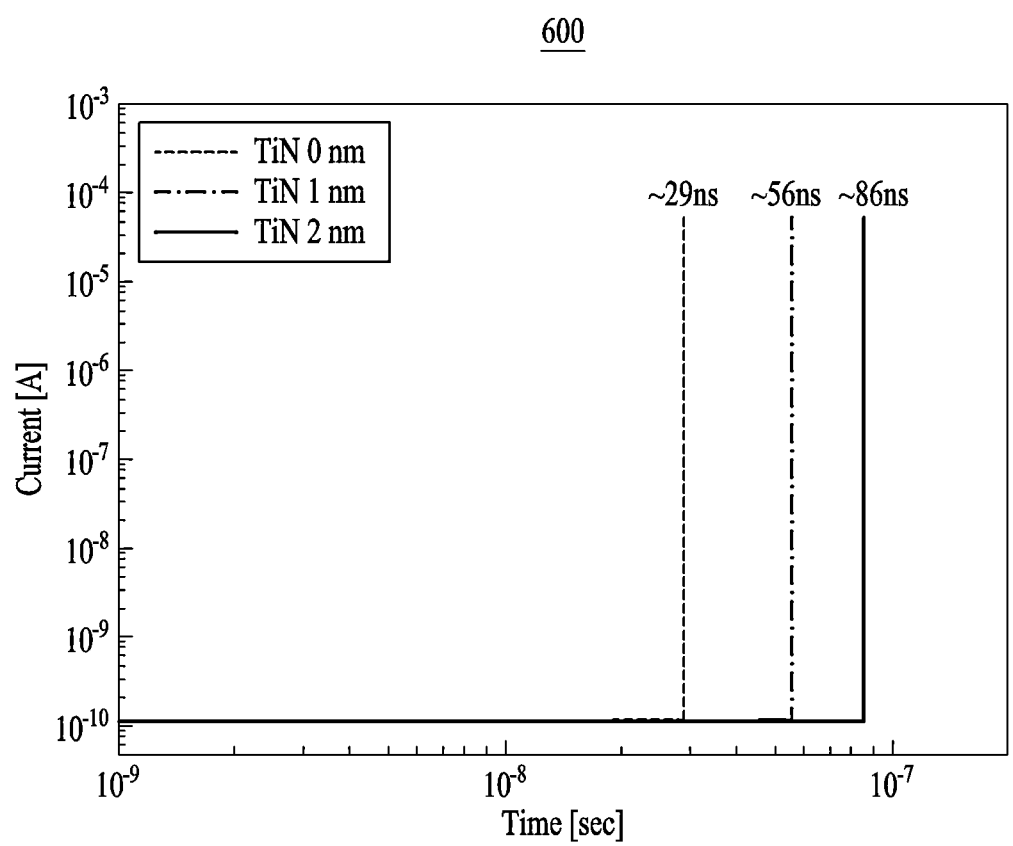
FIG. 6A illustrates a switching time dependent upon a thickness change in a diffusion control layer according to an embodiment of the present disclosure.

FIG. 6A illustrates a switching time dependent upon a thickness change in a diffusion control layer according to an embodiment of the present disclosure.

FIG. 6A illustrates a switching time change dependent upon the thickness of the diffusion control layer according to an embodiment of the present disclosure.

Referring to graph 600 of FIG. 6A, a switching time increases as the thickness of the diffusion control layer formed of TiN increases.

In particular, a switching time may be 29 ns when the thickness of the diffusion control layer is 0 nm, a switching time may be 56 ns when the thickness of the diffusion control layer is 1 nm, and a switching time may be 86 ns when the thickness of the diffusion control layer is 2 nm. Here, a switching time may represent a time during which the magnitude of a constant current is measured.

Figure 6B:
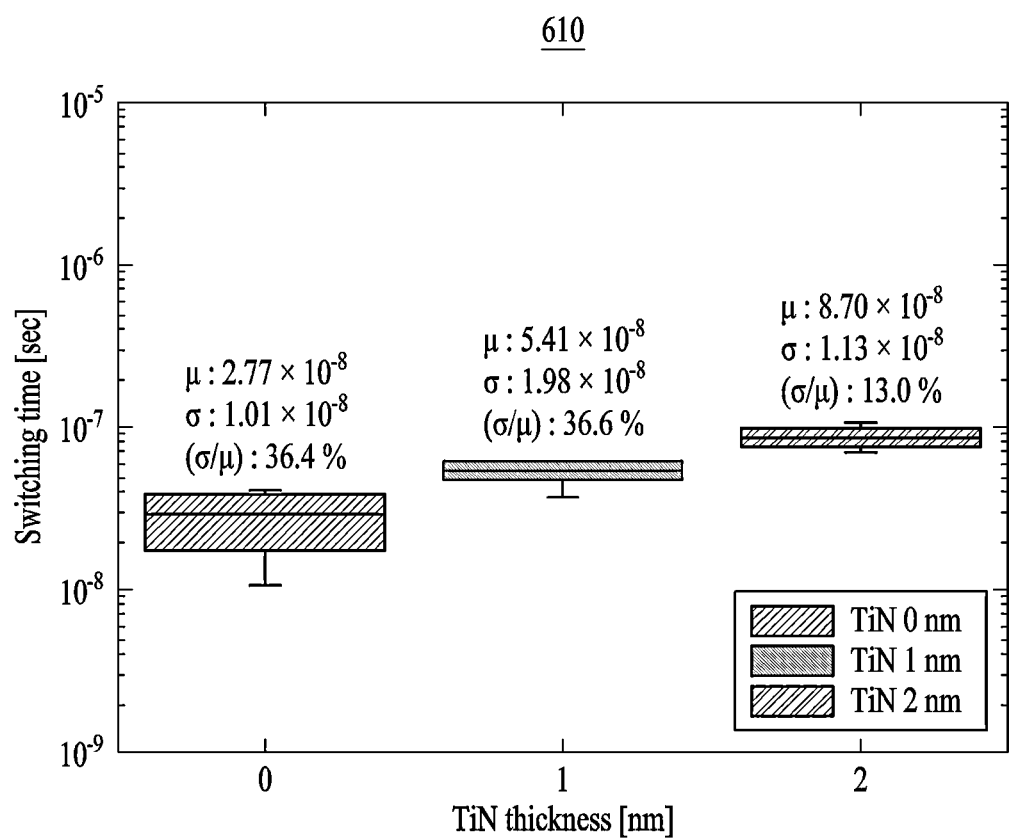
FIG. 6B illustrates statistical switching time values dependent upon a thickness change in the diffusion control layers according to embodiments of the present disclosure.

FIG. 6B illustrates statistical switching time values dependent upon a thickness change in the diffusion control layers according to embodiments of the present disclosure.

FIG. 6B illustrates statistical values of switching time dependent upon the thicknesses of the diffusion control layers according to embodiments of the present disclosure.

From graph 610 of FIG. 6B, a switching time change dependent upon a thickness change in the diffusion control layer can be confirmed. That is, the switching time increases as the thickness of the diffusion control layer increases.

Accordingly, as the thickness of the diffusion control layer increases, the diffusion control layer may adjust a switching time, related to the generation of the metal filaments, to increase.

Figure 7:
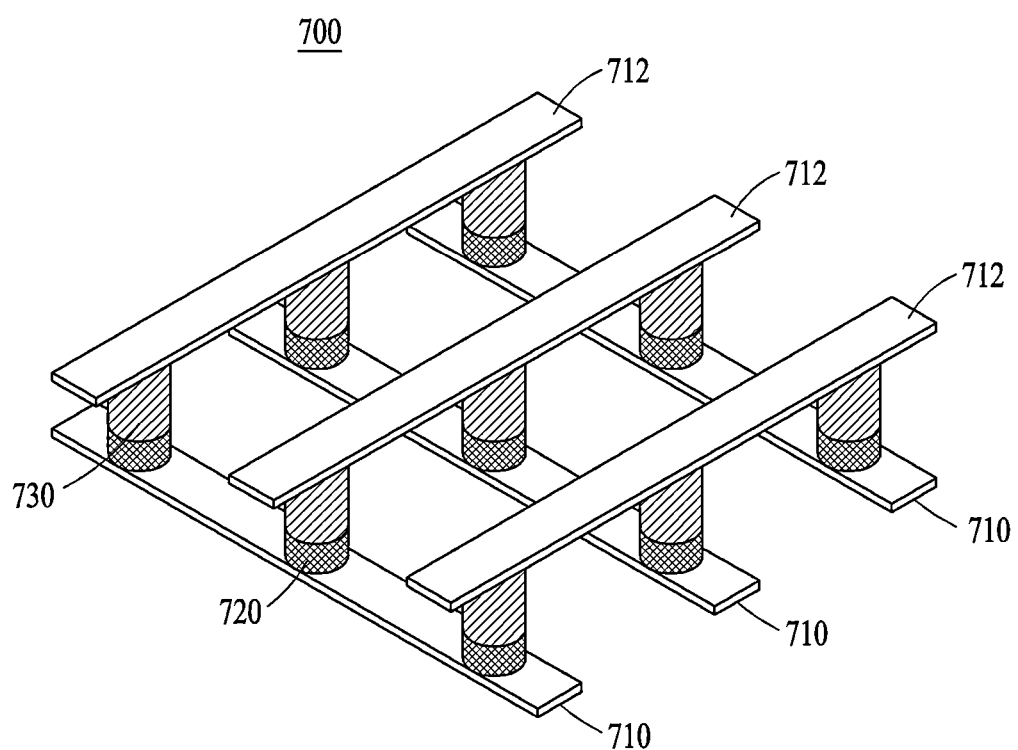
FIG. 7 illustrates a memory device according to an embodiment of the present disclosure.

FIG. 7 illustrates a memory device according to an embodiment of the present disclosure.

Referring to FIG. 7, a memory device 700 according to an embodiment of the present disclosure includes first wirings 710 and second wirings 712 crossing each other; memory layers 720 provided at intersections of the first wirings 710 and the second wirings 712; and selectors 730 provided between the memory layers 720 and the first wirings 710 or between the memory layers 720 and the second wirings 712.

Here, the selectors 730 have been described in the embodiments of the present disclosure with reference to FIG. 1, etc.

The memory layer 720 may be a phase-changed layer, a resistance-changed layer or a magnetoresistive layer. Accordingly, a memory device 200 according to an embodiment of the present disclosure may be a phase-changed RAM (PCRAM), a resistive RAM (RRAM), p-STT-MRAM or a magnetic RAM.

For example, the memory device 700 may include at least one of a storage class memory (SCM) and a 3D cross point memory.

When the selectors 730 according to an embodiment of the present disclosure are applied to the memory device 700 according to an embodiment of the present disclosure, a memory device having high selectivity and high reliability according to the characteristics of the selectors 730 according to the embodiment of the present disclosure may be manufactured.

In accordance with an embodiment, the present disclosure can provide a selector having the structure wherein a diffusion control layer is inserted between a metal-doped ion supply layer and a switching layer, thus being capable of securing high selectivity and low leakage current.

The present disclosure can control the electrical characteristics (threshold voltage, hold voltage and selectivity) of the selector by adjusting metal concentration distribution inside the switching layer depending upon the thickness of the diffusion control layer disposed between the metal-doped ion supply layer and the switching layer.

The present disclosure can secure the endurance of the selector by inserting the diffusion control layer between the metal-doped ion supply layer and the switching layer.

The present disclosure can provide a selector having high selectivity and high reliability which is necessary for the development of a highly integrated cross-point array memory having a 1selector-1resistor (1S1R) structure used in a storage class memory (SCM).

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

DESCRIPTION OF SYMBOLS

100: selector
101: second electrode
102: plug
103: substrate
104: switching layer
105: diffusion control layer
106: ion supply layer
107: first electrode

What is claimed is:

1. A selector, comprising, in the order of:
a first electrode;
an ion supply layer;
a diffusion control layer;
a switching layer; and
a second electrode,
wherein the ion supply layer is doped with a metal, and wherein the doped metal diffuses toward the second electrode;
wherein the doped metal diffuses from the ion supply layer into the switching layer so that metal concentration distribution inside the switching layer changes to generate metal filaments;
wherein the diffusion control layer serves to adjust electrical characteristics related to the generated metal filaments as an amount of the diffusing metal is adjusted in proportion to a thickness of the diffusion control layer; and
wherein the diffusion control layer adjusts a switching time, related to generation of the metal filaments, to increase as the thickness of the diffusion control layer increases.

2. The selector according to claim 1, wherein at least one electrical characteristic of a threshold voltage (Vth), a hold voltage (Vh) and a selectivity increases as the thickness of the diffusion control layer increases.

3. A selector, comprising, in the order of:
a first electrode;
an ion supply layer;
a diffusion control layer;
a switching layer; and
a second electrode,
wherein the ion supply layer is doped with a metal, and wherein the doped metal diffuses toward the second electrode;
wherein the doped metal diffuses from the ion supply layer into the switching layer so that metal concentration distribution inside the switching layer changes to generate metal filaments;
wherein the diffusion control layer serves to adjust electrical characteristics related to the generated metal filaments as an amount of the diffusing metal is adjusted in proportion to a thickness of the diffusion control layer;
wherein at least one electrical characteristic of a threshold voltage (Vth), a hold voltage (Vh) and a selectivity increases as the thickness of the diffusion control layer increases; and
wherein when the thickness of the diffusion control layer is 0 nm to 2 nm, the threshold voltage (Vth) is adjusted to 0.6 V to 1 V, the hold voltage (Vh) is adjusted to 0 V to 0.25 V, and the selectivity is adjusted to $4.59 \times 10^5$ to $3.10 \times 10^6$.

4. The selector according to claim 1, wherein the diffusion control layer adjusts endurance related to the generated metal filaments according to a change in the thickness of the diffusion control layer.

5. The selector according to claim 1, wherein the first and second electrodes are formed of a metal material selected from among platinum (Pt), tungsten (W), titanium nitride (TiN), tantalum nitride (TaN), gold (Au), rubidium (Ru), iridium (Ir), palladium (Pd), titanium (Ti), hafnium (Hf), molybdenum (Mo), niobium (Nb), and a combination thereof.

6. The selector according to claim 1, wherein the ion supply layer and the switching layer are formed of a chalcogenide material selected from among germanium sulfide (GeS2), germanium selenide (GeSe2), germanium telluride (GeTe), silicon sulfide (SiS), silicon selenide (SiSe), silicon telluride (SiTe), zinc sulfide (ZnS), zinc selenide (ZnSe), zinc telluride (ZnTe), antimony sulfide (SbS), antimony selenide (SbSe), antimony telluride (SbTe), and a combination thereof.

7. The selector according to claim 1, wherein the metal doped on the ion supply layer is selected from among copper (Cu), silver (Ag), nickel (Ni), titanium (Ti), and a combination thereof.

8. The selector according to claim 1, wherein the diffusion control layer is formed of a material selected from among titanium nitride (TiN), tantalum nitride (TaN), tungsten nitride (WN), silicon nitride (SiN), aluminium nitride (AlN), hafnium nitride (HfN), and a combination thereof.

9. A memory device, comprising:
first and second wirings crossing each other;
memory layers provided at intersections between the first wirings and the second wirings; and
one or more of the selector according to claim 1 provided between the memory layers and the first wirings or between the memory layers and the second wirings.

10. The memory device according to claim 9, wherein the memory device comprises a storage class memory (SCM), a 3D cross point memory, or a combination thereof.

11. The selector according to claim 3, wherein the diffusion control layer adjusts endurance related to the generated metal filaments according to a change in the thickness of the diffusion control layer.

12. The selector according to claim 3, wherein the first and second electrodes are formed of a metal material selected from among platinum (Pt), tungsten (W), titanium nitride (TiN), tantalum nitride (TaN), gold (Au), rubidium (Ru), iridium (Ir), palladium (Pd), titanium (Ti), hafnium (Hf), molybdenum (Mo), niobium (Nb), and a combination thereof.

13. The selector according to claim 3, wherein the ion supply layer and the switching layer are formed of a chalcogenide material selected from among germanium sulfide (GeS2), germanium selenide (GeSe2), germanium telluride (GeTe), silicon sulfide (SiS), silicon selenide (SiSe), silicon telluride (SiTe), zinc sulfide (ZnS), zinc selenide (ZnSe), zinc telluride (ZnTe), antimony sulfide (SbS), antimony selenide (SbSe), antimony telluride (SbTe), and a combination thereof.

14. The selector according to claim 3, wherein the metal doped on the ion supply layer is selected from among copper (Cu), silver (Ag), nickel (Ni), titanium (Ti), and a combination thereof.

15. The selector according to claim 3, wherein the diffusion control layer is formed of a material selected from among titanium nitride (TiN), tantalum nitride (TaN), tungsten nitride (WN), silicon nitride (SiN), aluminium nitride (AlN), hafnium nitride (HfN), and a combination thereof.

16. A memory device, comprising:
first and second wirings crossing each other;
memory layers provided at intersections between the first wirings and the second wirings; and
one or more of the selector according to claim 3 provided between the memory layers and the first wirings or between the memory layers and the second wirings.

17. The memory device according to claim 16, wherein the memory device comprises a storage class memory (SCM), a 3D cross point memory, or a combination thereof.

* * * * *